United States Patent [19]

Grundfest et al.

[11] Patent Number: 4,980,217

[45] Date of Patent: Dec. 25, 1990

[54] PRINTED CIRCUIT BOARD FABRICATION

[76] Inventors: Michael A. Grundfest, 99-41 64th Ave., Rego Park, N.Y. 11374; Joseph A. Grundfest, 3113 38th St., N.W., Washington, D.C. 20016

[21] Appl. No.: 226,013

[22] Filed: Jul. 29, 1988

[51] Int. Cl.⁵ .............................................. B32B 3/02
[52] U.S. Cl. .................................... 428/113; 428/137; 428/209; 428/294; 428/901; 361/397; 361/398; 174/255
[58] Field of Search ............... 428/113, 137, 209, 294, 428/901; 361/397, 398; 174/68.5

[56] References Cited

U.S. PATENT DOCUMENTS

| 3,258,387 | 6/1966 | Brown et al. | 428/325 |
| 3,972,765 | 8/1976 | Kondo et al. | 428/429 |
| 3,988,408 | 10/1976 | Haining et al. | 264/104 |
| 4,550,051 | 10/1985 | Spielau et al. | 428/418 |

FOREIGN PATENT DOCUMENTS

| 1282106 | 12/1961 | France . |
| 60-011320A | 1/1985 | Japan . |
| 2251132 | 10/1987 | Japan . |
| 89787 | 7/1937 | Sweden . |
| 0975457 | 11/1982 | U.S.S.R. . |
| 1224786 | 3/1971 | United Kingdom . |

OTHER PUBLICATIONS

Jerry Murray, "Today's Substrates," Nov. 1987, *Circuit Manufacturing*-pp. 25–28.

*Primary Examiner*—Patrick Ryan
*Attorney, Agent, or Firm*—Sughrue, Mion, Zinn, Macpeak & Seas

[57] ABSTRACT

The reinforcing fibers in a printed circuit board laminate are arranged in an ordered manner to leave fiber-free zones for the formation of holes. The holes may be oblong to enhance the connection to electrical leads of components mounted on the printed circuit board. The holes may be oriented with their long dimensions transverse to the side of an electrical component, and the electrical component may have its leads correspondingly oriented, to improve wiring flexibility and allow more direct wiring paths.

18 Claims, 3 Drawing Sheets

OCTOGONAL FIBER-FREE SPACES

A,B,C AND D AREAS OF FIBER-FREE SPACES

PRINTED CIRCUIT BOARD FABRICATION

BACKGROUND OF THE INVENTION

The present invention relates to the design and construction of a reinforced matrix, typically a laminate, as well as to processes for manufacturing such laminates.

The present invention relates more particularly to a fiber reinforced plastic laminate substrate having one or more fiber free areas arranged in a pattern designed to facilitate the manufacture of printed circuit boards (PCBs), also known as Printed Wiring.

The circuit board is the dominant technology used in the assembly of discrete components into operating circuits. With improvements in electronic components and more stringent performance requirements for electronic circuits, the properties of the laminates used in printed circuit boards have also been upgraded, e.g. with fiberglass reinforced high performance plastics such as FR-4. While the use of those improved laminates made possible many advanced products, it also created numerous fabrication and performance problems. Strenuous physical requirements were imposed on laminates. The laminates must withstand violence during processing. They are hit and gouged with drill bits, sprayed with caustic, dipped in acid, soaked in solvents, blasted with heat during reflow, and finally subjected to very high temperatures in a solder wave bath.

Woven fiberglass reinforced plastic laminates such as epoxy, silicon, etc., are recognized as having the best mechanical, electrical and chemical properties as related to the requirements for printed circuit boards. These laminates have high bending strength, surface strength, volume resistivity and bonding strength. They also have low water absorption, low dielectric constant and a low dissipation factor. However, all of these desirable properties are characteristics of the laminate before it is fabricated into a printed circuit board, especially before the mounting holes are drilled and before the board is subjected to many chemical baths at different temperatures and subsequently stored in ambient atmosphere. The laminates are expected to survive printed circuit board fabrication essentially unchanged in mechanical and electrical properties and be able to withstand further miscellaneous abuse for an indefinite number of years. In practice, however, the mechanical as well as electrical properties of the circuit board are significantly reduced, and this has created numerous, persistent and well-recognized performance problems.

For example, in presently available laminates the reinforcing fibers are located practically at random throughout the laminate. It is often necessary to drill a large number of small holes in a printed circuit board, with each hole resulting in the breaking of many reinforcing fibers. It has been established by testing that discontinuous fibers or shorter fibers contribute less to the strength of a laminate than long continuous fibers. As described by A. Kelly and W. R. Tyson, *High-Strength Material*, published by John Wiley & Sons: "The average tensile stress in a fiber is always less than that found in continuous fibers. The strength of the composite is then always less than that found for continuous fibers. The strength increases as the length of the fibers increases." It can therefore be concluded that after drilling the board does not preserve the mechanical properties of the original laminate, since the fibers and surrounding laminate are broken up. Consequently, the board in its final form has a reduced mechanical strength.

Another factor that affects the mechanical strength of the laminate is the degree of adhesion of the plastic matrix to the fibers. It is customary to cover the fibers with an adhesion-promoting substance. However, during drilling there are fiber ends exposed on the inner surface of the hole, and fibers are pulled and twisted and substantially separated from surrounding plastic. This not only has an adverse effect on the mechanical properties of the laminate but also permits moisture to penetrate the plastic, e.g., when the laminate is later submerged in chemical baths. This creates current leakage paths between component leads and lowers the insulation properties of the circuit board, distorting the intended circuit performance. It also creates "blow-outs" during in-hole plating when this moisture hidden under the plating evaporates. These defects make the board useless, or nearly so, for many critical applications.

The volume resistivity is affected due to the voids created by hole drilling between the cut-off fiberglass ends and the plastic on the inside hole surface, and the resulting moisture entrance during bath processing. This will have an adverse effect on the generally low dielectric constant throughout the laminate, and the same is true with respect to the dissipation factor. All of these effects are in the most critical areas between closely spaced holes and consequently between component leads, thereby significantly degrading circuit performance.

Another well recognized drawback of the fiberglass reinforced laminate is that it is difficult to fabricate into a functional board, because the drilling or punching of holes is made very difficult due to the strength of the fibers. The have been many efforts improve the workability of a laminate.

One such effort is outlined in U.S. Pat. No. 4,550,051 to Sprelau et al. According to the teaching of this patent, the laminated is built of different outer and inner layers. The outer layers consist of fiberglass reinforced epoxy, while the inner core consists of resin impregnated flat textile forms of synthetic thermo-plastic fibers. The goal of this patent is apparently to construct a laminate that is easier to drill. However, quality is sacrificed by replacing fiberglass reinforcing with synthetic plastic fibers inside the laminate structure, and any improvement in workability is only partially achieved because some abrasive glass fibers still have to be cut in the drilling process.

The drilled holes also present a problem with respect to dimensional stability. The precise positioning of the holes is very important, but even if the holes are drilled precisely in the desired locations, the dimensions of the board change due to moisture absorption by the boards during processing steps in various baths as well by absorbing moisture from the air. The drilled holes with open internal surfaces with exposed broken glass fibers tend to increase this moisture absorption by the board. The large number of holes per board area substantially increases the moisture absorption and consequently the dimensional changes in the board.

Hole drilling has also presented a problem due to the abrasiveness of the glass fibers. Special hard alloys must be used for the drill bits, and the heat developed during drilling was found to soften the plastic and create smirs, necessitating the development of a technique for desmiring.

The above are only a few of the many serious performance as well as cost problems created by the design of the reinforced laminate.

A great deal of fine engineering has been devoted to the effort to inspect the boards at every step of production. Laminates are inspected before shipment and as received. All holes are inspected, after drilling, for hole surface quality using semi-automatic equipment. Assembled units are checked for solder faults, bridging, cold solder joints etc.

A rejection rate of 30 percent has been reported and is considered a necessary cost of doing business. The efforts have been directed to finding every fault on every board through inspection and to minimize the effect of some problems, rather than to find and eliminate the causes of those persistent problems.

A further drawback of present circuit boards relates to the size and spacing of the holes. The shape and the size of the mounting holes in the board are determined by the shape and size of the component leads as well by the fabricating process.

The holes in the fiber reinforced laminate circuit boards can be drilled, or sometimes punched. The drilled holes are round, by definition. The punched holes are also round, because a round punch is best able to withstand the punching pressure. On the other hand, the leads of the components to be mounted, e.g., a Dual In-Line Package (DIP), are rectangular. As shown in FIG. 5, the diameter DH of the mounting hole is therefore determined by the diagonal of the rectangular cross section of the lead, and the diameter is typically increased to compensate for dimensional tolerances of location. In FIG. 5, "l" and "n" represent the length and width, respectively, of the lead.

The round shape of the holes and flat shape of the leads creates numerous problems. To provide a solder connection, the hole is surrounded on the board by a conductive ring, or land, which is is connected to a conductor line and has a diameter DL. The holes are spaced at a distance "t"—referred to as the pitch. The distance C1 between the outside land diameters, considering the nominal dimensions as well as the dimensional tolerances, is often close and consequently results in solder bridging during wave soldering.

The close location of the lands also precludes the running of conductors between them, complicating the conductor patterns of the board and reducing the possible component density per square inch of board. When conductors are designed to run between solder lands, they are very narrow, and the fabrication of narrow conductors creates severe manufacturing problems.

A number of attempts have been made to improve the quality and manufacturability of printed circuit boards. U.S. Pat. No. 3,972,765 to Kondo et al addresses the difficulties in the drilling and punching of mounting holes in woven fiberglass reinforced epoxy impregnated laminates, with a goal of reducing the cost of the laminate and the cost of fabricating mounting holes. Kondo introduces a non-woven fabric of glass fiber impregnated with an epoxy resin as the prepreg, which may improve the workability as well as the fabricating cost of a laminate. However, Kondo does not address the problems created by the cutting of the glass fibers during the fabrication of holes.

U.S. Pat. No. 3,258,387 to Brown et al teaches a method of manufacturing laminates that provides a composite material in which mineral flakes are the major constituent and are oriented in parallel planes. Brown et al addresses the problem of the cost of laminate production, but does not address the effects of hole fabrication on the properties of a printed circuit board made from the laminate.

U.S. Pat. No. 3,616,613 to Benzinger et al addresses the workability of a laminate. Benzinger et al teaches a punchable printed circuit board laminate formed by laminating resin impregnated woven glass fiber sheets to the surface of an impregnated non-woven fiber glass core. The combination of woven and non-woven glass reinforced fibers might reduce the punching pressures to some extent. However, while the laminate is referred to as "punchable" it will require dies with strong punches. The cost of such dies can be justified only on long production runs of the same board. The problems of broken fibers are not addressed.

U.S. Pat. No. 3,988,408 to Haining et al teaches a process for stabilizing a printed circuit board substrate or laminate through application of a number of laminate conditioning and baking cycles which function to provide the laminates with dimensional stability. This addresses the problem of dimensional stability of the laminate, but does not address the problems created by the fabrication of mounting holes and the breaking of the reinforcing fibers.

SUMMARY OF THE INVENTION

It is an object of the present invention to provide a lamination that will eliminate most if not all of the above-mentioned problems.

It is a further object of this invention to reduce the need for inspections, to upgrade the mechanical and electrical performance, to reduce the fabricating cost of circuit boards and to increase the useful life of a completely assembled board.

Briefly, the design of the present invention takes into account that the leads of the components, are spaced at a standard pitch "t," usually either 0.100 or 0.050 inches. The fibers are arranged in the laminate so as to provide "fiber free" spots spaced at the standard pitch. Consequently, a number of mounting holes at needed locations can be drilled (or punched) without cutting any of the reinforcing fibers. There are several suitable manufacturing approaches to control the fiber locations to achieve this goal.

The present invention also offers the possibility of fabricating holes in a shape that differs from round. Since the punching does not require the cutting of reinforcing fibers, the punching pressure is lower and a rectangular punch is sufficiently strong to produce the holes in the laminate.

The present invention utilizes most of the presently available processes and equipment while achieving the advantages offered by the invention.

BRIEF DESCRIPTION OF THE DRAWINGS

The invention will be more clearly understood from the following description in conjunction with the accompanying drawings, in which.

DETAILED DESCRIPTION OF THE INVENTION

A preferred embodiment of the invention will now be described with reference to the accompanying Figures.

A fiber enforced laminate is usually made from a pile of so-called "prepregs," with a prepreg consisting of reinforcing fibers that are woven in any of several styles. One such style uses fibers oriented in "X" and "Y" directions. Various other styles are available.

The fibers are dipped into the plastic of the matrix, and the plastic is then cured to an intermediate stage, referred to as "stage B". At this stage, the plastic is attached to the fibers, but is still soft and pliable. To produce a laminate, a number of prepregs are piled up and then fully cured under heat and pressure. After full curing, the laminate is rigid.

Figure 1:
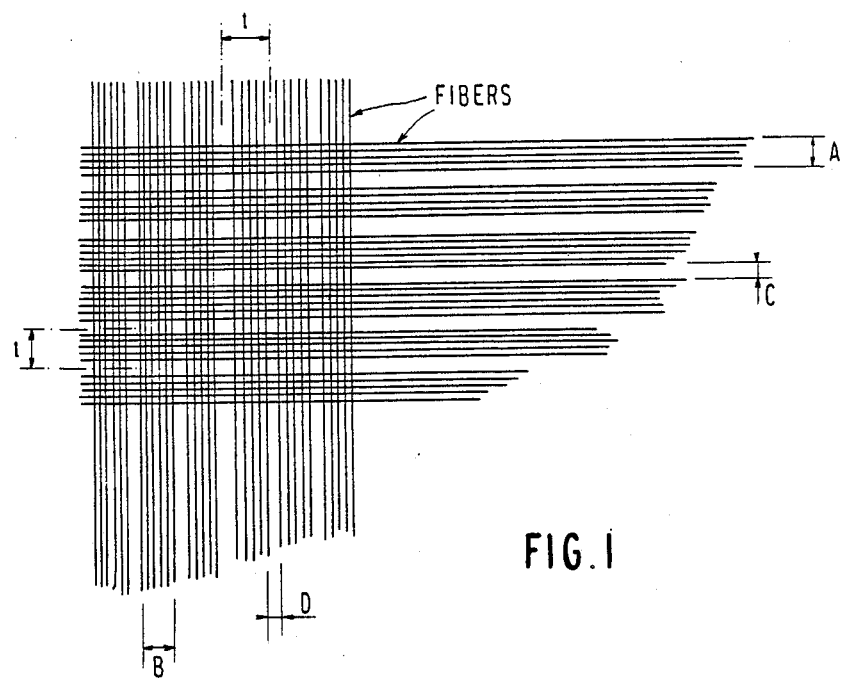
FIG. 1 is an illustration of the fiber arrangements in a first example of the present invention.

With reference to FIG. 1, in the case of a woven fiber style in "XY" orientation, the "X" oriented fibers are placed in bunches of width A, with gaps therebetween of width C. The "Y" oriented fibers would be in groups of width B with intervening gaps of width D. While not necessary, the widths of the fiber groups and gap spaces in the X and Y directions could be identical, i.e., with A=B and C=D. The distance between the center lines of the gaps C or D is equal to a pitch "t". The locations defined at the intersections of the gaps C and D will define fiber-free spaces. The fiber net is then dipped into plastic and partially cured to the intermediate stage "B".

To produce a laminate, the prepregs thus formed are piled up to the desired total thickness and fully cured under pressure and heat. During pile-up, care is taken to align the fiber-free, plastic-filled spaces in the different prepreg sheets. As a result, there is a rigid, glass reinforced plastic laminate with Modular Grid Fiber-Free Hole location. (MGFFH)

An alternative technique for forming the prepregs would be to begin with a reinforcing substance formed into a uniform sheet, impregnate it with plastic and then dry or semicure it to the curing stage "B". The said reinforcing substance can be woven glass fibers, non-woven glass mats, glass whiskers etc. A pin, preferably tapered, is then inserted into the prepreg to move aside the reinforcing substance and create a fiber-free space. In a subsequent operation, this fiber-free space can be filled with the same type of plastic used in the original preparation of the prepreg, the said plastic precured to stage "B".

A number of the thus-treated prepregs are then properly aligned and stacked to obtain the required thickness, and are then finally cured in a press. To create the required number of fiber-free spaces, a required number of pins may be assembled on a pin holding plate. A second "stripping" plate with corresponding holes may be used to receive all of the pins. The prepreg to be threaded is placed between the two plates which are then pressed together.

Figure 2:
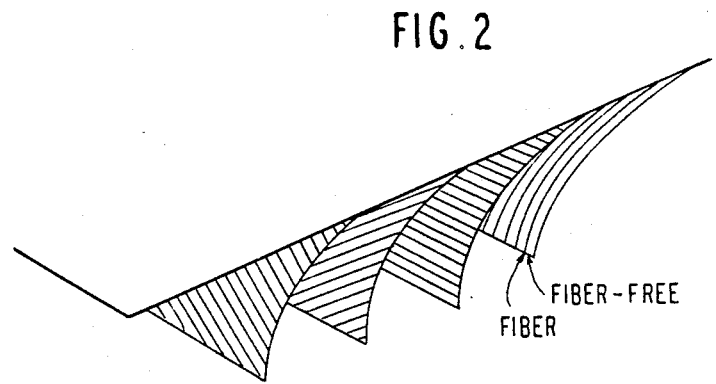
FIG. 2 is an illustration of an embodiment of the invention in which all fibers in a given layer are substantially parallel.
Figure 3:
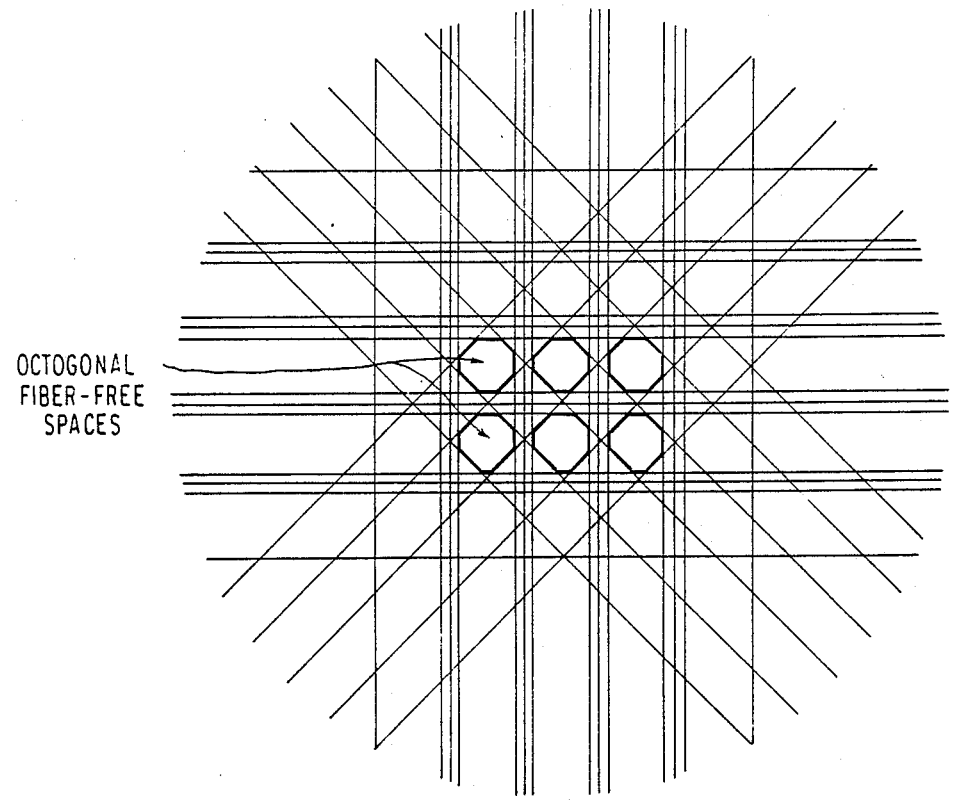
FIG. 3 is an illustration in which non-rectangular fiber-free spaces are realized by multiple layers at different angular orientations.

An alternative construction for the laminate is shown in FIG. 2. In this arrangement all of the fibers in any one layer run in the same direction, with the fibers in each layer being laid out in groups with intervening gaps as for either the X or the Y fibers in the arrangement of FIG. 1. Successive layers are then rotated when stacking the layers to thereby define the fiber-free spaces. If the same effect as in FIG. 1 is desired, successvie layers will be rotated by 90°. On the other hand, different effects can be achieved by constructing a laminate of layers having fibers running in more than merely the two orthogonal directions. For example, in the arrangement of FIG. 3, there are two different layers in four different orientations to obtain octagonal fiber-free spaces.

Figure 4:
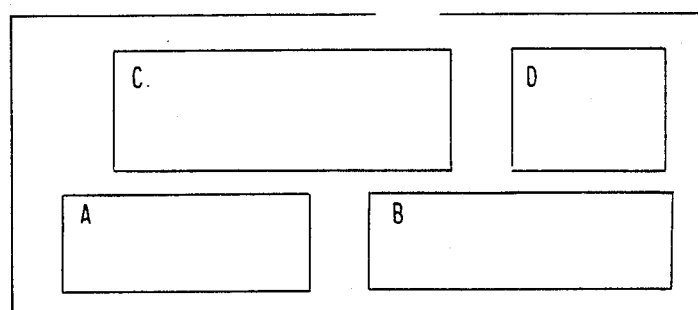
FIG. 4 is a diagram of an arrangement according to the present invention in which discrete areas of a printed circuit board are fiber-free zones.

A still further variation would be to produce the laminate with areas that contain fiber-free space, while other areas of the same laminate where no holes are intended do not have fiber-free spaces. This arrangement is generally shown in FIG. 4, and would be more useful if the exact location of the holes is not known at the time of fabrication. Since no fibers will be cut in those areas, the full reinforcing function will be utilized.

The advantages of the printed circuit board construction of the present invention will be apparent. The fiberless hole surfaces of the present invention will significantly reduce moisture absorption without any further modifications of the manufacturing processes. The laminate of this invention will therefore result in a dimensionally stable board that will reduce component insertion problems significantly, and thereby promote the use of automatic component insertion techniques.

Further, whereas the cut-up fibers in prior art boards are ineffective in reinforcing the finally fabricated board, the laminate constructed according to the present invention with "fiber-free" hole locations will eliminate the ineffective short fiber lengths and consequently bring the mechanical properties of a fabricated printed circuit board closer to those of the original laminate.

The locations of the fiber-free areas on a modular grid of a selected pitch will permit the mass production of laminates that can be subsequently customized by fabricating the mounting holes as required for mounting components of given lead spacing pitch in selected locations. This is especially advantageous in that there are only two or three standard component lead spacing pitches.

At present, the punching of holes is considered economical only for very large runs due in part to the cost of the punching apparatus. The presence of fiber-free spaces will lower considerably the force required to fabricate mounting holes by punching. This will simplify the requirements for stamping dies and make the building of such dies more economical, so that it will also be viable to punch small quantities of boards.

A further aspect of the invention relates to the size and shape of the holes. Components to be assembled on printed circuit boards are often packaged in Dual In-Line Packages (DIPs). The leads are flat and narrowed at the bottom. The narrow parts of the leads are inserted into the mounting hole, while the wider part of the lead provides a stop shoulder, as described earlier with reference to FIG. 5.

The present invention also offers the possibility of fabricating holes in a shape that differs from round. Since the punching does not require the cutting of reinforcing fibers, the punching pressure is lower and a rectangular punch is sufficiently strong to produce the holes in the laminate.

The selected shape of the mounting holes provides several advantages. The oblong hole, corresponding to the shape of the component leads, provides a uniform spacing between adjacent lands permits conductors to be placed between them, thereby allowing more direct wiring paths and shortening the lengths of the conductors, an important advantage in high-speed circuits.

To take full advantage of spacing of rectangular holes, the DIP component leads may be twisted by 90° at a height slightly above the hole-entry point, so that the long dimension of the rectangular cross-section of the lead will be perpendicular to the lateral side of the DIP.

Figure 5:
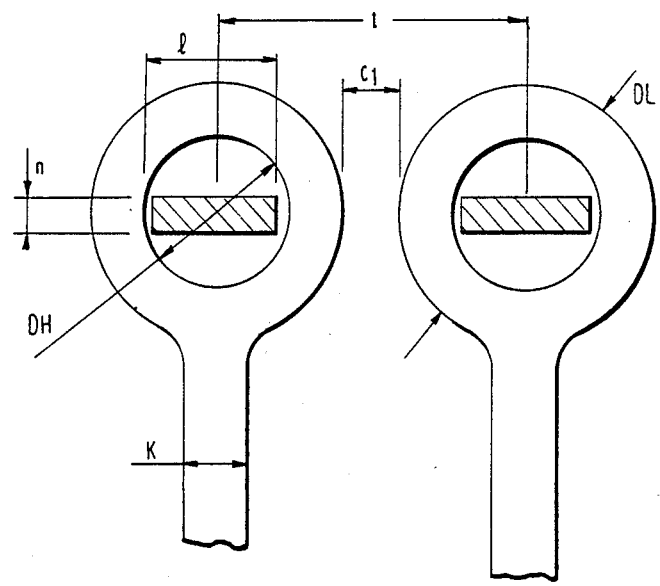
FIG. 5 is an illustration of the lead and hole relationship in a typical prior art printed circuit board.
Figure 6:
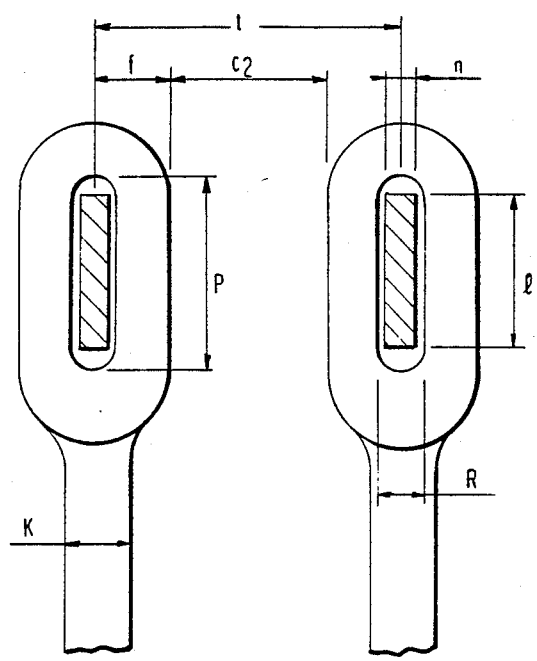
FIG. 6 is an illustration similar to FIG. 5 but showing an improved lead and hole relationship possible according to a further variation of the present invention.

In FIG. 6, reference characters t, n, and l designate the pitch, length, and width of the leads, the same as in FIG. 5. f designates the land width, C2 designates the clearance between successive lands, lands, and P and R designate the length and width, respectively, of the mounting hole. As shown in FIG. 6, in comparison to FIG. 5, the mounting holes are still spaced at a pitch "t". The oblong hole shape corresponds to the shape and dimensions of the lead. Thus, for a lead of the same length and a land of the same width, the dimension of the hole in the direction of the leads is substantially reduced and the clearance between lands is increased from C1 to C2.

There are, of course, a number of changes which could be made in the implementation of the invention described above. For example, it is not necessary that the laminate be fabricated of prepregs, and of course the concepts of the arrangements of FIGS. 1-3 could be combined, e.g., with a plurality of layers used with some having woven fibers running in multiple directions and others having only unidirectional fibers.

It would also be possible to use reinforcing fibers having other than a circular cross section. For example, a single flat fiber could be used in place of a fiber group in the arrangement of FIG. 1, e.g., with the flat fiber having a width A for fibers running in the X direction and a width Y for fibers running in the Y direction.

It will be appreciated that various further changes and modifications may be made to the embodiments described above without departing from the spirit and scope of the invention as defined in the appended claims.

What is claimed is:

1. A substrate of reinforced material, said substrate including:
    reinforcing members arranged with spaces therebetween at desired locations to permit the formation of holes in said spaces; and
    a material surrounding said reinforcing members and filling said spaces, said material being more easily penetratable at said spaces due to the absence of said reinforcing members than at other locations of said substrate to thereby permit the formation of holes in said spaces.

2. A substrate according to claim 1, wherein each said space accommodates the formation of a single hole for accepting an electrical circuit component lead.

3. A substrate according to claim 1, wherein each space accommodates the formation of plural holes for receiving electrical circuit component leads.

4. A substrate of reinforced material, said substrate including:
    reinforcing members arranged with spaces therebetween at desired locations to permit the formation of holes in said spaces, wherein said reinforcing members comprise a plurality of first members running in a first direction and a plurality of second members running in a second direction transverse to said first direction, said first members being arranged in a plurality of groups with first gaps between said groups and the width of said first gaps being greater than the spacing between adjacent fibers within a group, with second gas between at least some of said second members, and the intersections of said first and second gaps defining said spaces.

5. A substrate according to claim 4, wherein said first and second directions are substantially perpendicular to one another.

6. A substrate according to claim 1, wherein said reinforcing members are fibers.

7. A substrate of reinforced material, said substrate including:
    reinforcing members arranged with spaces therebetween at desired locations to permit the formation of holes in said spaces, wherein said reinforcing members comprise a plurality of first members running in a first direction and a plurality of second members running in a second direction transverse to said first direction, said first members having an oblong cross section.

8. A substrate according to claim 7, wherein the long dimension of the cross section of each of said first members is longer than the spacing between adjacent first members.

9. A laminate of a plurality of layers of reinforced material, said laminate comprising a plurality of first reinforcing members running in a first direction and a plurality of second reinforcing members running in a second direction transverse to said first direction, said first reinforcing members being arranged in a plurality of groups with first gaps between said groups and the width of said first gaps being greater than the spacing between adjacent reinforcing members within a group, with second gaps between at least some of said second reinforcing members, and the intersections of said first and second gaps defining said spaces.

10. A laminate according to claim 9, wherein said plurality of layers comprises a first layer having all of its reinforcing members running in said first direction.

11. A laminate according to claim 10, wherein said plurality of layers comprises a second layer having all of its reinforcing members running in said second direction.

12. A laminate according to claim 10, wherein said plurality of layers includes first and second layers each having both of said first and second reinforcing members.

13. A laminate according to claim 9, wherein said second reinforcing members are arranged in a plurality of groups with said second gaps between said groups and the width of said second gaps being greater than the spacing between adjacent second reinforcing members within a group.

14. A laminate according to claim 9, wherein said plurality of layers comprises at least three layers each having reinforcing members running in a different direction.

15. A laminate according to claim 9, wherein each said space accommodates the formation of a single hole for accepting an electrical circuit component lead.

16. A laminate according to claim 9, wherein each said space accommodates the formation of plural holes for receiving electrical circuit component leads.

17. A laminate according to claim 9, wherein said reinforcing members are embedded in a matrix, the material of said matrix being different from the material in said spaces.

18. A laminate according to claim 9, wherein said reinforcing members are fibers.

* * * * *